United States Patent [19]

Breazeale

[11] 4,073,969
[45] Feb. 14, 1978

[54] METHOD OF FABRICATING A PHOTOCONDUCTIVE DETECTOR OF INCREASED RESPONSIVITY

[75] Inventor: Billy H. Breazeale, Plano, Tex.

[73] Assignee: Texas Instruments Incorporated, Dallas, Tex.

[21] Appl. No.: 649,189

[22] Filed: Jan. 15, 1976

Related U.S. Application Data

[62] Division of Ser. No. 553,346, Feb. 26, 1975, Pat. No. 3,963,925.

[51] Int. Cl.² .............................................. B05D 5/12
[52] U.S. Cl. .................................. 427/75; 427/259; 427/265; 29/572; 29/578; 29/579
[58] Field of Search ................ 427/275, 265, 259; 29/572, 579, 578; 250/338; 357/30

[56] References Cited

U.S. PATENT DOCUMENTS

| | | | |
|---|---|---|---|
| 3,013,232 | 12/1961 | Lubin | 338/17 |
| 3,187,414 | 6/1965 | Hagle et al. | 427/75 X |
| 3,361,594 | 1/1968 | Iles et al. | 29/572 X |
| 3,671,313 | 6/1972 | Reynolds | 427/75 X |
| 3,842,274 | 10/1974 | Greene et al. | 250/338 X |
| 3,851,174 | 11/1974 | Tynan et al. | 250/338 X |
| 3,962,778 | 6/1976 | Palmer | 427/75 X |

Primary Examiner—Ronald H. Smith
Assistant Examiner—Evan K. Lawrence
Attorney, Agent, or Firm—Rene E. Grossman; Alva H. Bandy

[57] ABSTRACT

A method of fabricating a photoconductive detector of increased responsivity, such as an infrared detector, from a slab of N-type, intrinsic bulk semiconductor material comprises shielding part of the detector active area between the positive and negative contacts with a material limiting photon exposure of the active area to retain a reduced detector active area sufficiently spaced from the negative contact to permit negligible loss in responsivity due to recombination of the photogenerated hole carriers at the negative contact.

6 Claims, 8 Drawing Figures

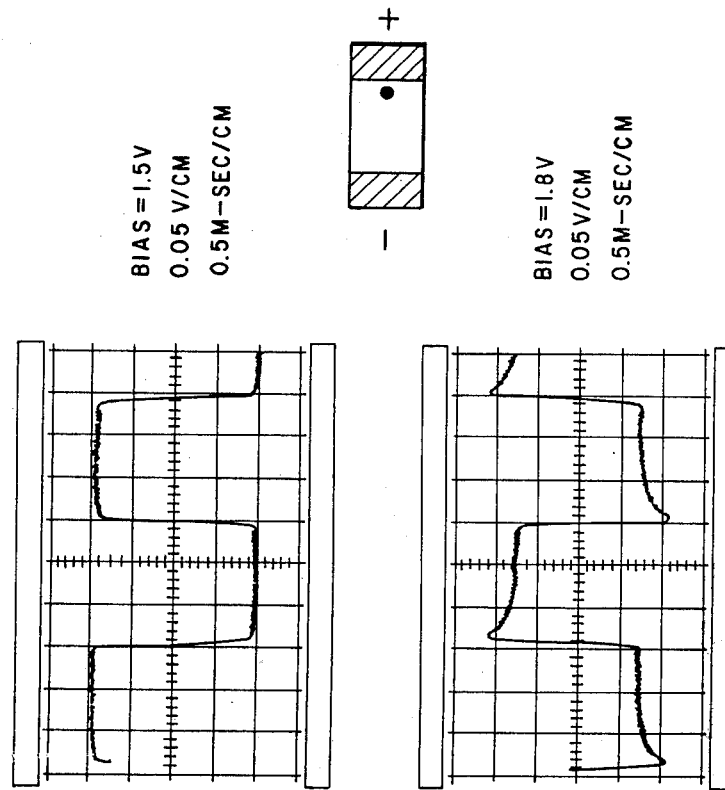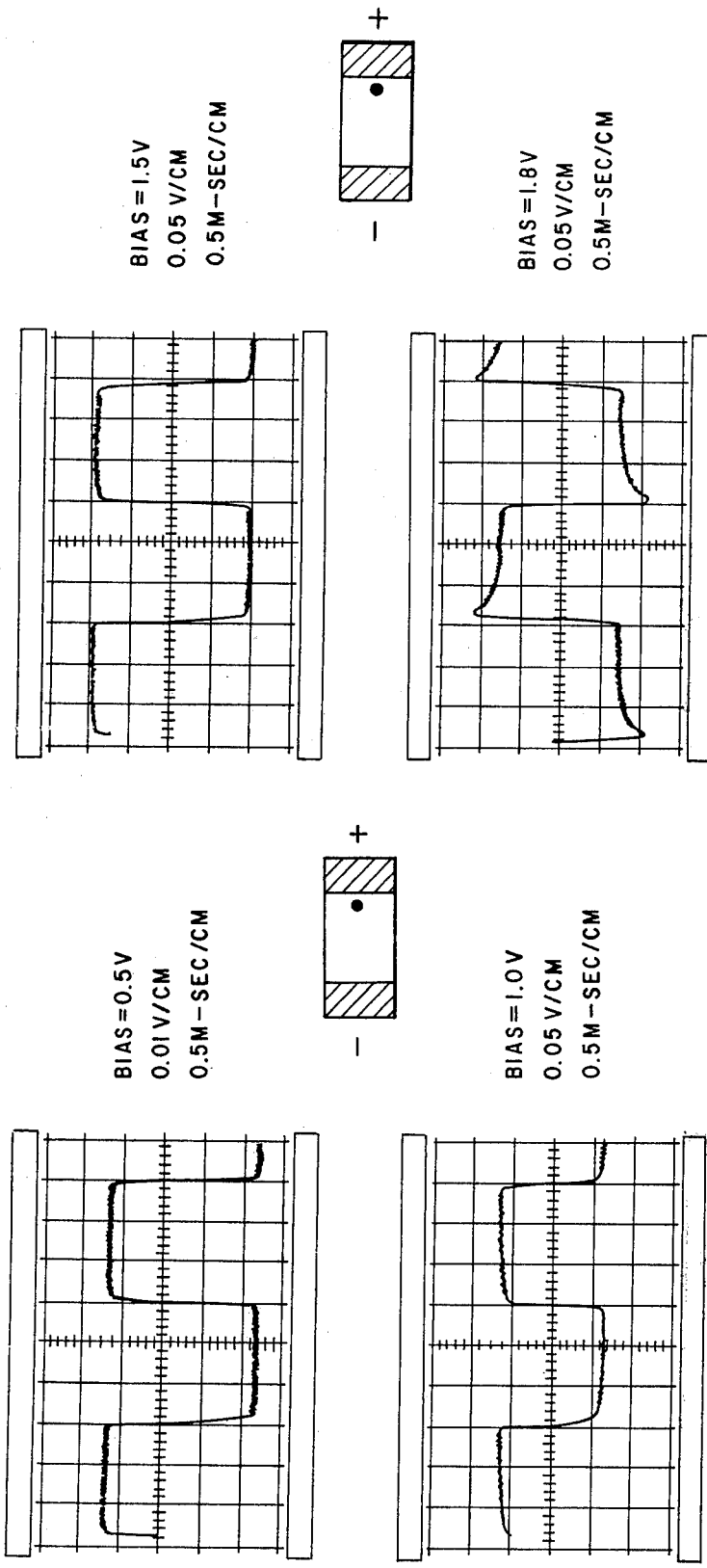
Fig. 6a  Fig. 6b  Fig. 6c  Fig. 6d

METHOD OF FABRICATING A PHOTOCONDUCTIVE DETECTOR OF INCREASED RESPONSIVITY

This is a division, of application Ser. No. 553,346, filed Feb. 26, 1975, now U.S. Pat. No. 3,963,925.

BACKGROUND OF THE INVENTION

1. Field of the Invention

This invention relates to a method of fabricating a photoconductive detector, such as an infrared detector, having increased photoconductive responsivity

2. Description of the Prior Art

In the past, photoconductive detectors, such as infrared detectors, of small size and of intrinsic material have had responsivities several times less than that predicted by using bulk life time data and the equations of photoconductivity. Increasing the bias or voltage across the photoconductive detectors increased their responsivity up to a limit after which signal levels saturated and responsivity leveled off. Further efforts to increase the responsivity led to the increase of the size of the collecting optics. Increasing the size of the collecting optics had the disadvantage of higher cost, greater size, and increased weight of the infrared detector system. Others in the art determined that for small size detectors extrinsic semiconductor materials might have to be used though they must operate at a substantially lower temperature than could be achieved with intrinsic semiconductor materials.

SUMMARY OF THE INVENTION

Accordingly, it is an object of the present invention to provide a photoconductive detector which is small in size, light in weight and economical to manufacture.

Another object of the invention is to provide a method for fabricating a small size photoconductive detector of intrinsic material having increased photoconductive responsivity.

Still another object of the invention is to provide a photoconductive detector of intrinsic material which is small in size, light in weight and economical to manufacture, and operable at substantially higher temperatures than corresponding detectors using extrinsic semiconductor materials.

Semiconductor material which is very pure is called intrinsic. At absolute zero all of the valence electrons are tightly held by the parent atoms and also, through the covalent bonds, by other atoms. The electrons are not free to move through the crystal structure and thus cannot conduct electricity. For this reason, an intrinsic semiconductor at absolute zero temperature behaves like an insulator. An increase in temperature means an increase in the energy of each atom; the energy is given to one of the valence electrons of the atom. By this process, a valence electron may acquire sufficient energy to break away from its parent atom and in so doing, break one of the covalent bonds. This electron is free to wander through the crystal structure and it is not bound to any particular atom. It is a free electron, and can act as a charge carrier if a voltage (bias) is applied to the material by means of electrical contacts (positive and negative terminals). When the electron left its parent atom it left behind a hole. When a hole is created, an electron from a neighboring atom can easily fill the hole by breaking its own covalent bond and jumping over to the first atom. Whenever a hole is created it is considered to have a positive charge; thus, when the hole moves, there is a flow of positive charge. Electrons travel about one hundred times faster than the holes in HgCdTe. The free holes have a lifetime in HgCdTe of about $10^{-6}$ seconds, i.e., they recombine with free electrons after a $10^{-6}$ second travel time. If they reach the negative terminal or contact before recombination, a part of their useful life for photoconduction is lost and they are said to have been swept out; this phenomenon is called "sweepout".

To achieve maximum photoconductivity and maximum responsivity in a photoconductive detector the slow moving hole carriers are used as minority carriers. Thus, the intrinsic bulk material of photoconductive detectors is N type (electrons determine conduction). Applicant has found that the minority carriers contribute to photoconductivity only while they remain in the body of the photoconductor and that electrical contacts act as regions of intense recombination of photogenerated carriers.

Thus, briefly stated, this invention comprises reducing the size of the photoconductive detector active area between the contacts in the interelectrode dimension by some artificial shielding means to allow wide separation of the active area from the electrical contacts.

BRIEF DESCRIPTION OF THE DRAWINGS

The features characteristic of the embodiment of the invention may best be understood by reference to the following detailed description when read in conjunction with the accompanying drawings, wherein:

FIGS. 6a through d represent a time constant effect observed at high bias levels which indicate that the signal saturation is not as ideal for the spot near the contact position recorded in FIG. 5b;

DESCRIPTION OF THE PREFERRED EMBODIMENTS

Figure 1A:
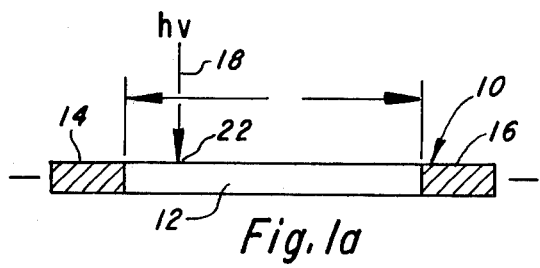
FIGS. 1a through e present in graphic form the role of minority carriers in photoconductivity.
Figure 1B:
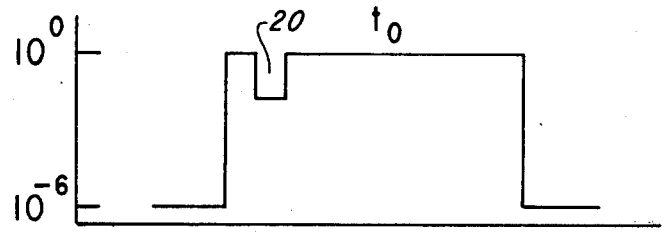
Figure 1C:
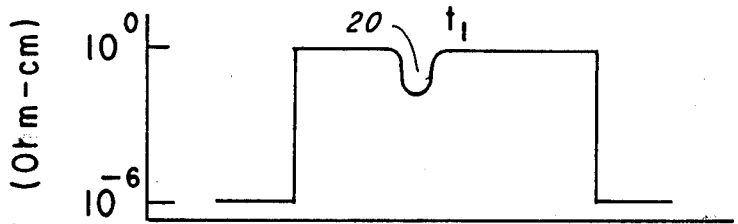
Figure 1D:
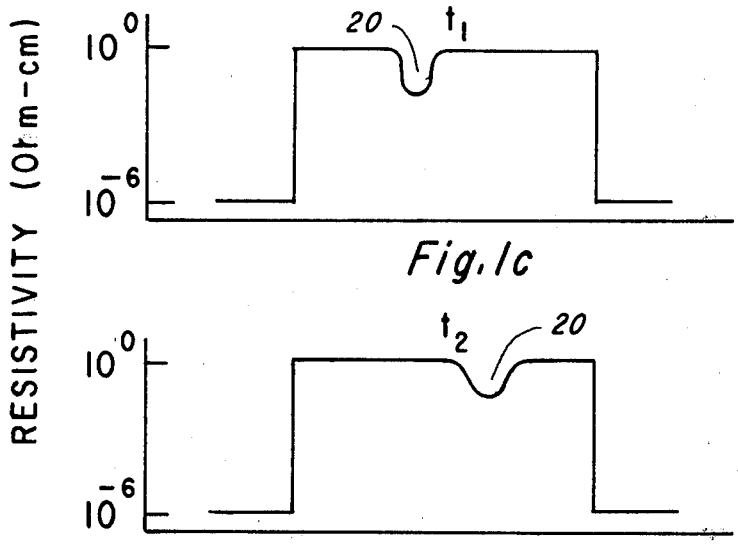
Figure 1E:
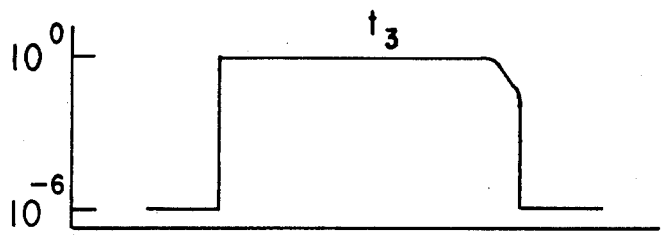

Referring to the drawings, the photoconductive semiconductor detector embodiment of the invention may best be understood from an example using HgCdTe detectors. A $Hg_{.8}Cd_{.2}Te$ detector having a band gap of approximately 0.09 eV has demonstrated that an intrinsic semiconductor can perform with good sensitivities at temperatures well above the corresponding extrinsic semiconductor having sensitivity through the same wavelength range 8 to 14 microns. In intrinsic semiconductor detectors, minority carrier effects are present and, in most cases, determine the performance of photoconductors. Under low field conditions, the equations for signal and noise are written in terms of minority carrier parameters with a signal and noise being linear functions of bias. However, at high fields, nonlinearities appear; the most dramatic for the Hg$_{.8}$Cd$_{.2}$Te example arise from sweepout of the minority carriers. It has been determined that the minority carriers contribute to photoconduction only while they remain in the body of the photoconductor. When they drift to a contact, they are lost from the sensitive part of the semiconductor and no longer contribute to photoconductivity. The presence or absence of sweepout is determined by the drift length of the minority carriers $\mu$ E $\tau$ where $\mu$ is the drift mobility, E is the electric field, and $\tau$ is the carrier lifetime. When the drift length becomes comparable to sample dimensions, significant loss of carriers occurs due to minority carrier sweepout. Or to put it in another way it is as if the contacts were draining away photo generated carriers faster than they would normally recombine if contacts were not present.

The roll of minority carriers in photoconductivity can be visualized by utilizing FIGS. 1a through e. The situation depicted is the conductivity profile of a prior art photoconductor 10 including its active region 12, and positive and negative contacts 14 and 16 (FIG. 1a). FIGS. 1b-e are drawn to emphasize that the conductivity of the contacts 14 and 16 is much higher than the active part 12 of the photoconductor; thus, when carriers move from the central high resistivity region to the much lower resistivity contact regions, they no longer contribute significantly to the photosignal. A spot illumination 18 (FIG. 1a) of the photoconductor is considered a pulse having a duration short compared to times of interest. Equal numbers of electrons and holes are produced and the resistivity in the local region decreases as shown at 20 (FIG. 1b); photoconductivity is increased due to this local increase of conductivity. For an N-type sample, the minority carriers are holes and will drift to the right, negative terminal, with bias polarities, as shown in FIG. 1a. Since the dielectric relaxation time of this material is 10$^{-12}$ seconds, space charge neutrality is maintained to a very high degree, so the excess concentration migrates to the right along with the hole distribution. This occurs due to field distributions in spite of the fact that the holes and electrons flow in opposite directions.

As times passes, diffusion will cause distribution to spread out and this is indicated (FIGS. 1c and d) by the rounding of the conductivity profile as time and position change. Both the broadening and the transport of the conductivity distribution continues until it reaches the negative contact 16 (FIGS. 1a and e). As the minority carrier distribution moves into the contact, it is removed from the active part of the semiconductor and no longer contributes to photoconductivity. The expression for the photoconductive current $i_s$ of HgCdTe as a function of position is given by the expression:

$$i_s = (1+b) q \frac{\mu_p E \tau'}{L} \phi \eta W L \qquad (1)$$

where $q$ is the electronic charge, $\mu_p$ the hole mobility, $\phi$ the signal flux, $\eta$ the detector efficiency, W and L the sample width and length, $b$ the electron-to-hole mobility ratio and $\tau'$ the effective lifetime of carriers at a point $x$ such as point 22 (FIG. 1a). The effective carrier lifetime can be reduced because carriers are swept out before recombination, thus, $$\frac{1}{\tau'} = \frac{1}{\tau} + \frac{\mu_p E}{L-x} \qquad (2)$$

In this expression, $\tau$ is the bulk recombination lifetime and $(L-x)/\mu_p E$ is the drift time to the contact 16.

Figure 2A:
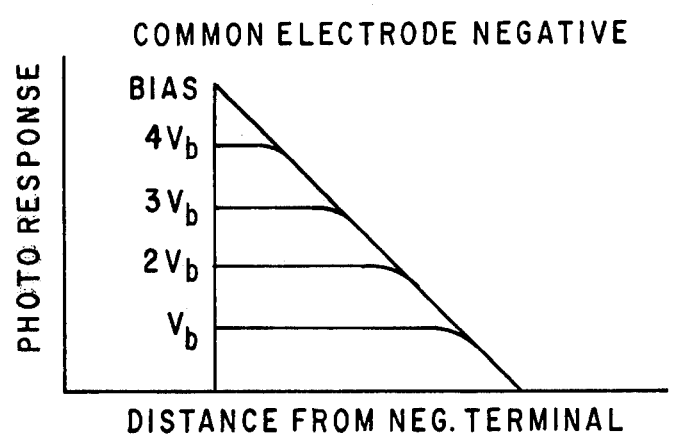
FIGS. 2a and b represent theoretical detector response for several different bias conditions for two opposite polarity directions.
Figure 2B:
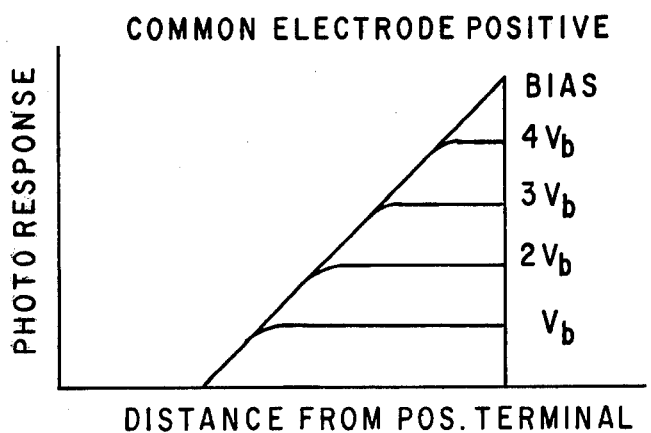

Equation 1 is plotted in FIGS. 2a and b for several different bias conditions. Two parts of the figure are for two opposite polarity directions, i.e., the positive and negative terminals 14 and 16 are reversed for FIG. 2b. In each case, minority carrier-holes close to the negative contact will reach the contact at low biases resulting in a loss of sensitivity near the one contact. As the bias voltage increases, the sensitivity does not increase in the swept-out region but does in the non-swept-out region. Finally, at high biases, charges are being swept out from the whole of the detector and no further increase of signal occurs. The sensitivity is maximum at the positive electrode 14 and falls to essentially zero at the negative contact 16.

Figure 3:
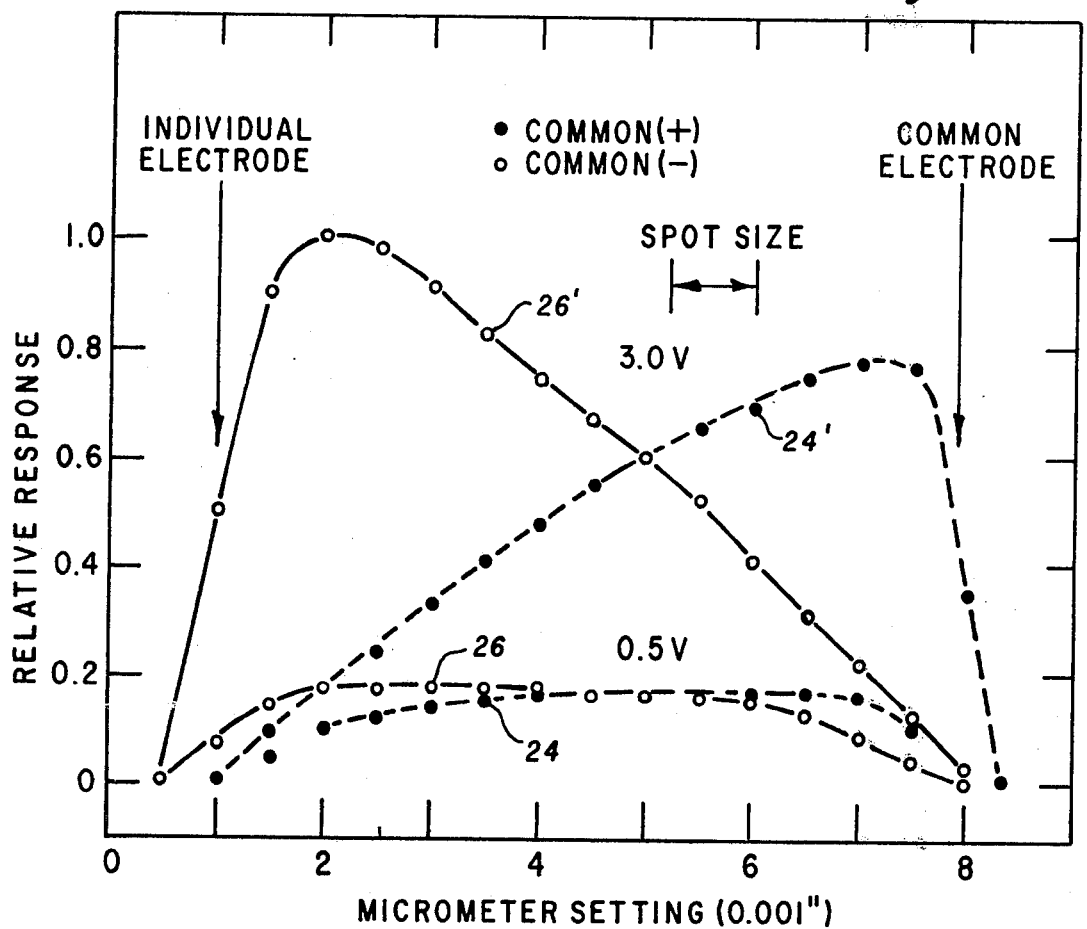
FIG. 3 illustrates the results of sweepout in a HgCdTe detector as observed by spot scan measurements.

FIG. 3 illustrates sweepout in HgCdTe as observed by spot scan measurements. In this figure are plotted the low and high field sensitivity profiles for both 24 and 24' and 26 and 26' for both positive and negative bias, respectively. As expected, at lower electric fields the response is essentially uniform over the active portion of the semiconductor. On the other hand with larger electric fields, the high sensitivity occurs near the positive electrode while the response falls to small values near the negative electrode. The rounding of the curves is primarily a consequence of a half-mil spot size used. As mentioned above, when the bias level reaches such a sufficiently high level that charges are swept out from the whole of the photoconductor, signal levels saturate.

Figure 4:
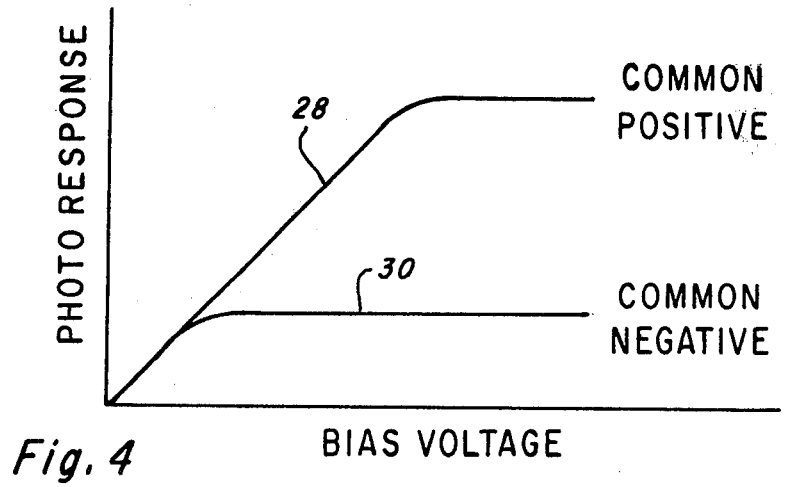
FIG. 4 is a plot of the theoretical signal saturation characteristics appearing with increasing fields and a fixed spot of illumination.

FIG. 4 is a plot of signal saturation characteristics occurring with increasing fields and a fixed spot of illumination (Equation 1). The two curves 28 and 30 are for the two polarity directions of the detector of FIG. 1a to emphasize that the saturation is achieved regardless of polarity, and also that, for a spot illumination near the positive contact, saturation occurs at much higher fields.

Figure 5A:
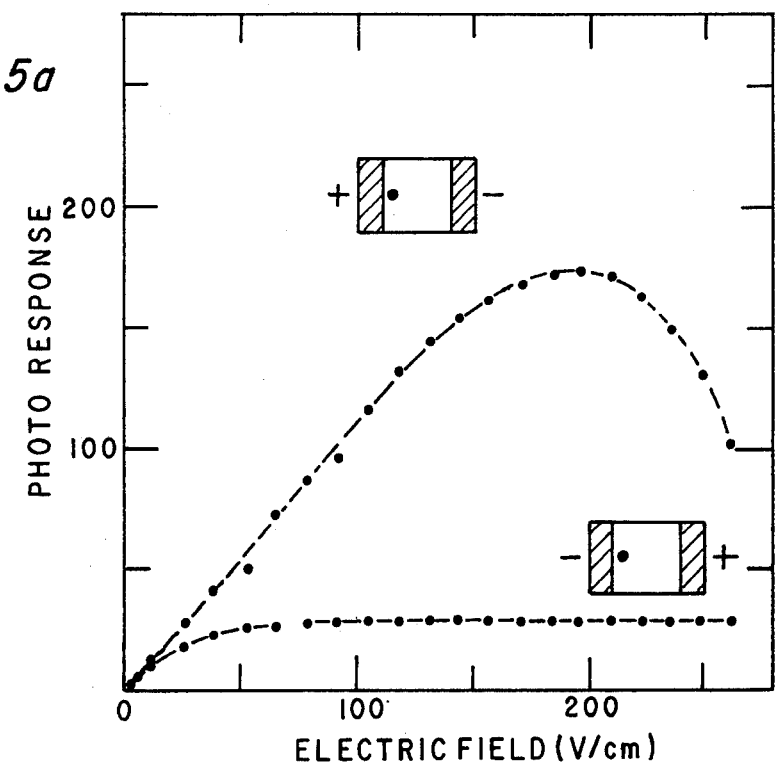
FIGS. 5a and b represent the difference between positive and negative bias signal characteristics.

The difference between positive and negative bias signal characteristics are shown in FIGS. 5a and b. The pair of curves in each graph of FIGS. 5a and b are for opposite polarities, one pair for a spot near one contact and a second pair for the spot moved to the other contact. The curve of FIG. 5a is very close to the ideal form. The voltage for saturation of the signal, corresponding to carriers transported across the sample, is 2.3 volts. Thus, for the interelectrode spacing of 1.6 $\times$ 10$^{-2}$cm the $\mu_p \tau$ product is 1.1 $\times$ 10$^{-4}$cm$^2$/volt. Assuming a $\mu$ value of 500 cm$^2$/v-sec yields a lifetime of 2$\times$10$^{-7}$ sec.

Figure 5B:
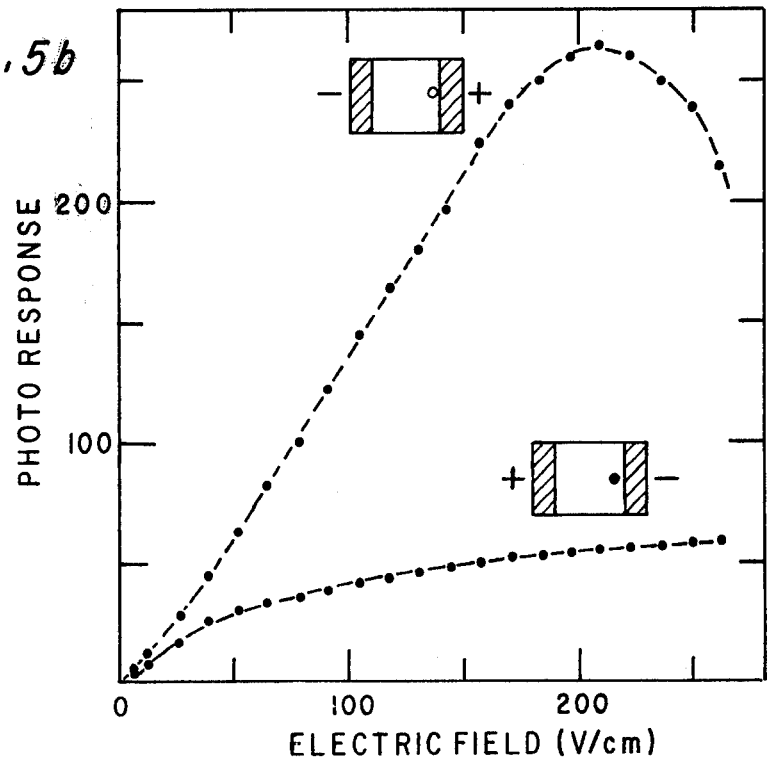

It is to be noted that signal saturation is not as ideal for a spot near the contact position recorded in FIG. 5b. Other evidence of non-ideal characteristics have been seen especially at high biases. The most dramatic is a time constant effect which is observed at high bias levels. FIGS. 6a through d illustrate this point. At moderate bias levels 0.5 volts, the signal voltage appears as a square wave since the sweep speed is much lower than the known fractional microsecond response time. As the bias increases to 1.0 volts, a slow component starts to appear. This response time component disappears at 1.5 volts and reappears as a loss of signal at even higher bias levels of 1.8 volts. This effect was much stronger when a spot of illumination was near the positive contact and nearly absent when the sample was illuminated near the negative contact.

From the above discussion, it is readily seen how a small detector can have a responsivity several times less than what is predicted by simple photoconductor analysis and is occasioned by the electrical contacts acting as extremely efficient recombination regions which greatly alter the photoconductive process as far away as a diffusion length from the contacts. The distance of a hole diffusion length $L_p$ is given by the equation:

$$L_p = \left(\frac{\mu_p kT\tau_p}{q}\right)^{\frac{1}{2}} \quad (3)$$

where $k$ = Boltzman constant, and T = degrees Kelvin.

For 0.1 eV HgCdTe at 77° K and a hole mobility $\mu_p$ = 600 cm$^2$ V$^{-1}$S$^{-1}$, this becomes $$L_p \simeq 2\,\tau_p^{1/2}\,\text{cm}. \quad (4)$$

Thus, if the hole lifetime were two $\mu$seconds, minority carriers as far as 28 $\mu$m (1 mil) from the contacts would tend to diffuse to the contacts and recombine there. The recombination produces an effectively lower detector response time and thus reduces responsivity. This phenomenon, when analyzed quantitatively and approximated by considering the effective lifetime ($\tau_{eff}$) for carriers generated at the center of a detector is shown by the following equation where:

$$\tau_{eff} = \tau_p\left(1 - \frac{1}{\cosh\frac{L}{2L_p}}\right) \quad (5)$$

The actual effect on responsivity is obtained by substituting $\tau_{eff}$ for $\tau_p$ in the equation for voltage responsivity giving:

$$R_v = \frac{\eta\,V\tau_p}{n_o L\,w\,t\,\epsilon} = \frac{\eta\,V\tau_{eff}}{n_o L\,W\,t\,\epsilon} \quad (6)$$

or in the terms of power:

$$R_v = \frac{\eta\,\tau_{eff}P^{1/2}}{\epsilon\,(wn_o t)^{3/2}(q\mu_n L)^{1/2}} \quad (7)$$

where
$\eta$ = quantam efficiency,
$\epsilon$ = band gap energy,
$w$ = detector width,
$n_o$ = electron concentration and,
$t$ = detector thickness.

For small detectors $L/L_p$ is less than one, and equation 5 becomes $$\tau_{eff} \simeq \frac{L^2}{8(L_p)^2}\,\tau_p \quad (8)$$

Thus,

-continued $$R_v \simeq \frac{\eta(qP)^{1/2} L^{3/2}}{8\epsilon\mu_p kT\,(wn_o t)^{3/2}\mu_n^{1/2}}\quad L < L_p \quad (9)$$

Equation (9) shows that there is a responsivity improvement as L is increased at a constant power. As L becomes larger than $L_p$ the improvement factor reduces and vanishes at L $\simeq$ 5$L_p$.

As an example, a 0.1 eV HgCdTe detector having $\tau_p$ = 4.0 $\mu$ sec. and $n_0 = 3\times10^{14}$cm$^{-3}$ with contacts 50 $\mu$m (2 mils) apart had a highest response time observed of equal to 0.63 microseconds. As $L_p \simeq$ 40 $\mu$m (1.6 mils), then $L/L_p \simeq$ 1.25 which gives an effective lifetime ($\tau_{eff}$) of 0.66 $\mu$secs. from equation 5. If L is increased to 3$L_p$, equation 5 yields a value of 2.3 $\mu$secs. As seen from equation 7 the responsivity ($R_v$) is directly related to the effective lifetime ($\tau_{eff}$). thus, as $\tau_{eff}$ is increased from 0.66 to 2.3 $\mu$secs., a significant improvement in responsivity ($R_v$) is achieved. This demonstrates that significant responsivity improvement is achieved when L is increased to 3$L_p$ or larger. Thus, for example, a two-mil by two mil 0.1 eV HgCdTe detector would approach optimum responsivity with a contact separation of 4.8 mils. The active area of 2$\times$2 mil$^2$ can remain the same since the responsivity definition includes normalized active area.

Figure 7A:
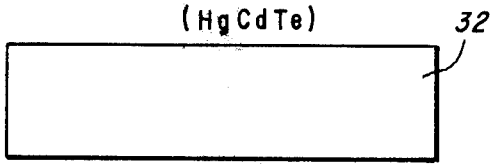
FIGS. 7a through d depict, for a first embodiment of the invention, the steps of fabricating the improved infrared photoconductive detector.
Figure 7B:
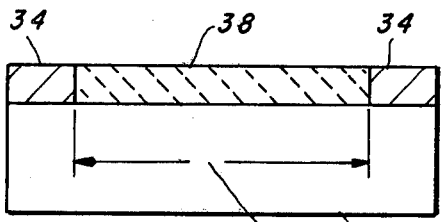
Figure 7C:
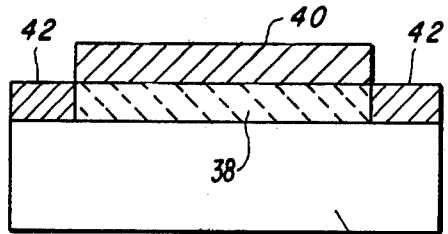
Figure 7D:
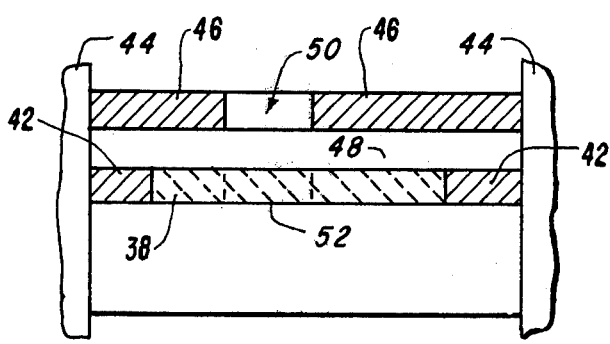

A method of fabricating a small size (about 2 to 6 square mils) detector element is shown in FIGS. 7a–c. An IR detector may be fabricated as a linear array consisting of a plurality of detector elements aligned in a row. Each detector element has a positive electrode and a group of detector elements which can have a common negative electrode. In practice a negative electrode is made common to five detector elements. Referring to FIG. 7a in which is shown a cross section of a detector slab 32 of bulk, intrinsic, detector semiconductive material, such as, for example, HcCdTe. For a detector element having a two mil by two mil active area the width of the slab should be sufficient to accommodate a positive and negative contact separation of at least 4.8 mils. The slab 32 is masked with a metal mask 34 (FIG. 7b); the mask defines the interelectrode spacing 36 along the width of the slab. The masked slab is placed in a vacuum chamber and an antireflection layer 38 of insulating material with the proper optical characteristics such as zinc sulphide is evaporated onto the surface (FIG. 7b). The slab is then removed from the vacuum chamber and the metal mask used to define the interelectrode spacing is replaced by a mask 40 (FIG. 7c) to define the contact areas. Metal contacts 42 such as, for example, indium contacts are formed thereon by any suitable technique such as chemical deposition, thermal evaporation, or sputtering. After the contacts 42 are formed, the contact mask 40 is removed and the slab mounted in a housing 44 (FIG. 7d) in a spaced relationship beneath an apertured mask 46 of a suitable photon absorbing or reflecting material such as a metal or thermosetting plastic. The space 48 between the apertured mask 46, and the metal contacts 42 and antireflection layer 38 form an isolating media such as, for example, an air or vacuum space. The aperture mask 46 has an aperture 50 which defines the active region 52 of the detector between the electrodes 42.

Figure 8A:
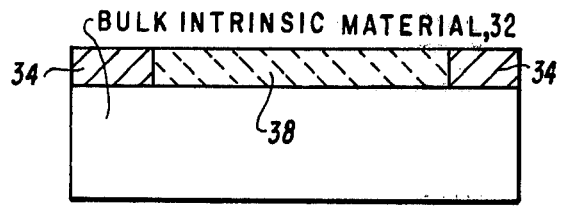
FIGS. 8a through c depict for a second embodiment of the invention the steps of fabricating the improved infrared photoconductive detector.
Figure 8B:
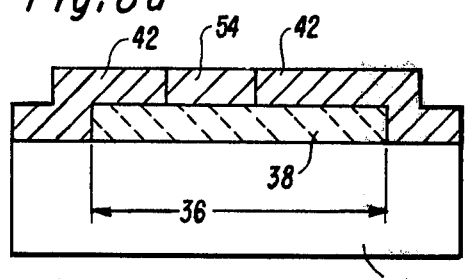
Figure 8C:
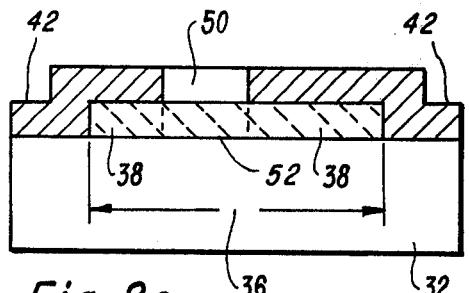

FIGS. 8a–c show a second embodiment of the invention in which FIG. 8a shows in cross section the slab of bulk intrinsic material constituting the slab 32. The metal mask 34 is positioned over the slab 32 (FIG. 8a) to define the interelectrode spacing region on the slab upon which an anti-reflecting and insulating layer 38 is formed by the evaporation technique previously described. Then the metal mask 34 is replaced with contact area and active region defining mask 54 (FIG. 8a) which blocks out the desired active area 52 (FIG. 8c) of the slab 32. Metal contacts 42 (FIG. 8b) are then formed by evaporation techniques well known to those skilled in the art on the metal contact areas and over that portion of the interelectrode spacing region 36 not blocked out by the electrode and active region defining mask 54. The mask 54 is then removed to form an aperture 50 (FIG. 8c) to define the active region between the contacts. In this manner the active area 52 as defined by the aperture 50 (FIG. 8c) can be made arbitrarily small to confine the photogeneration of carriers sufficiently away from the contacts to permit negligible loss in responsivity due to recombination at the contacts caused in turn by minority carrier diffusion and/or sweepout.

The active area need not be centered between the contacts but should be located some distance, relative to a minority carrier diffusion or drift length, from the electrodes. By moving the contacts away from the active area, minority carrier sweepout and diffusion have a diminished effect on reducing the responsivity. As the electrical contacts are moved apart relative to the active area, the responsivity increases faster than the resistance of the enlarging photoconductive expanse to a point where no more power is expended. For extensions beyond approximately three times the minority carrier diffusion length, more power must be dissipated to further increase the responsivity. Thus, for any particular active area and photoconductive material, there is an optimum size per unit power in terms of responsivity.

Although embodiments of the invention have been described herein, it will be apparent to a person skilled in the art that various modifications to the details of instructions shown and described maybe made without departing from the scope of this invention.

What is claimed is:

1. A method of fabricating a photoconductive detector of increased responsivity from a slab of N-type, intrinsic bulk semiconductor material having a positive and negative contact spaced one from the other formed thereon and defining a photoconductive detector active area therebetween comprising the step of shielding part of the detector active area with a material limiting photon exposure of said active area to retain a reduced detector active area sufficiently spaced from the negative contact to permit negligible loss in responsivity due to recombination of the photogenerated hole carriers at the negative contact.

2. A method of fabricating a photoconductive detector according to claim 1 wherein the step of shielding comprises mounting an opaque shield, having an aperture formed therein in a spaced relationship to the contacts over the slab between the contacts so that said aperture limits the active area receiving photons to said reduced active area.

3. A method of fabricating a photoconductive detector according to claim 1 wherein the spaced contacts are of photon absorbing material and the step of shielding comprises extending the spaced contacts over, and separated from, the slab between the contacts to form a an aperture spaced from the contacts so that said aperture limits the active area receiving photons to said reduced active area.

4. A method of fabricating a photoconductive detector of increased responsivity comprising:
    (a) selectively coating a slab of N-type, intrinsic bulk semiconductor material with antireflecting and insulating material to define two spaced uncoated slab areas for subsequent formation in the step (b) of a positive and negative contact spaced one from the other, said coating covering a photoconductive detector active area;
    (b) forming contacts on said uncoated slab areas; and
    (c) shielding part of the antireflecting and insulating material between the contacts with a material limiting photon exposure of said active area to retain a reduced detector active area sufficiently spaced from the contacts to permit negligible loss in responsivity due to recombination of the photogenerated hole carriers at the negative contact.

5. A method of fabricating a photoconductive detector according to claim 4 wherein the step of shielding the contacts comprises mounting a photon absorbing shield, having an aperture formed therein, above and spaced from the antireflecting and insulating material of the slab so that said aperture limits the active area receiving photons to said reduced active area.

6. A method of fabricating a photoconductive detector according to claim 4 comprising spacing the contacts apart about three times the minority carrier diffusion length.

* * * * *